US011355538B2

(12) United States Patent
Chang et al.

(10) Patent No.: US 11,355,538 B2
(45) Date of Patent: Jun. 7, 2022

(54) IMAGE SENSOR PANEL AND METHOD FOR FABRICATING THE SAME

(71) Applicant: Bidirectional Display Inc., Acton, MA (US)

(72) Inventors: Hsuanyeh Chang, Chestnut Hill, MA (US); Zachary Michael Thomas, Pittsburgh, PA (US)

(73) Assignee: Bidirectional Display, Inc., Acton, MA (US)

( * ) Notice: Subject to any disclaimer, the term of this patent is extended or adjusted under 35 U.S.C. 154(b) by 51 days.

(21) Appl. No.: 16/639,315

(22) PCT Filed: Aug. 15, 2018

(86) PCT No.: PCT/US2018/000201
§ 371 (c)(1),
(2) Date: Feb. 14, 2020

(87) PCT Pub. No.: WO2019/035930
PCT Pub. Date: Feb. 21, 2019

(65) Prior Publication Data
US 2021/0036035 A1 Feb. 4, 2021

Related U.S. Application Data

(60) Provisional application No. 62/545,958, filed on Aug. 15, 2017.

(51) Int. Cl.
*H01L 27/146* (2006.01)
(52) U.S. Cl.
CPC .... *H01L 27/1461* (2013.01); *H01L 27/14605* (2013.01); *H01L 27/14623* (2013.01)

(58) Field of Classification Search
CPC .......... H01L 27/1461; H01L 27/14605; H01L 27/14623; H01L 27/3272; H01L 27/3234; G09F 9/33
See application file for complete search history.

(56) References Cited

U.S. PATENT DOCUMENTS

| 9,312,486 | B2 * | 4/2016 | Kang | ................ H01L 51/0012 |
| 2004/0232814 | A1 * | 11/2004 | Sakai | ................ H01L 51/0005 |
| | | | | 313/310 |
| 2006/0220543 | A1 * | 10/2006 | Makiura | ............ H01L 51/5088 |
| | | | | 313/506 |
| 2007/0103062 | A1 * | 5/2007 | Jung | ................ H01L 27/3246 |
| | | | | 313/504 |
| 2007/0252518 | A1 * | 11/2007 | Lee | ..................... H01L 27/3283 |
| | | | | 313/504 |
| 2009/0243482 | A1 * | 10/2009 | Tohyama | ............ H01L 27/3272 |
| | | | | 313/505 |
| 2009/0322657 | A1 * | 12/2009 | Na | ..................... H01L 27/3246 |
| | | | | 345/76 |

(Continued)

FOREIGN PATENT DOCUMENTS

WO  WO-2014020817 A1 * 2/2014 .......... G02F 1/1343

*Primary Examiner* — Bitew A Dinke
(74) *Attorney, Agent, or Firm* — Hsuanyeh Law Group, PC

(57) ABSTRACT

The present disclosure provides an image sensor panel (ISP) and a method for fabricating the image sensor panel (ISP). In one aspect, the method includes forming a well in an assembly, forming a bottom electrode in the well, forming a photosensitive layer in the well, and forming a top electrode over the photosensitive layer.

15 Claims, 14 Drawing Sheets

(56) References Cited

U.S. PATENT DOCUMENTS

| | | | |
|---|---|---|---|
| 2010/0295033 A1* | 11/2010 | Rokuhara | H01L 27/3246 257/40 |
| 2014/0346450 A1* | 11/2014 | Lee | H01L 27/3246 257/40 |
| 2015/0115217 A1* | 4/2015 | Cho | H01L 51/5218 257/13 |
| 2015/0268754 A1* | 9/2015 | Chang | G06F 3/0421 345/175 |
| 2016/0111688 A1* | 4/2016 | Lee | H01L 27/3246 257/40 |
| 2017/0078513 A1* | 3/2017 | Chang | G06F 3/0304 |
| 2017/0242549 A1* | 8/2017 | Lim | G06K 9/00013 |
| 2018/0219054 A1* | 8/2018 | Han | H01L 27/3272 |

* cited by examiner

IMAGE SENSOR PANEL AND METHOD FOR FABRICATING THE SAME

RELATED APPLICATION

This application is a national stage under 35 U.S.C. 371 of International Application No. PCT/US2018/000201, filed Aug. 15, 2018, which claims the benefit of priority to U.S. Provisional Application No. 62/545,958, filed Aug. 15, 2017, the entire contents of both of which are incorporated herein by reference for all purposes.

The present disclosure relates to U.S. patent application Ser. No. 14/690,495, filed on Apr. 20, 2015 and issued as U.S. Pat. No. 9,122,349 on Sep. 1, 2015, which is a Continuation of International Application No. PCT/US15/021199, filed on Mar. 18, 2015, which claims priority to U.S. Provisional Application No. 62/025,772, filed on Jul. 17, 2014 and U.S. Provisional Application No. 61/955,223, filed on Mar. 19, 2014, the entire contents of all of which are incorporated herein by reference for all purposes.

The present disclosure further relates to U.S. Provisional Application No. 62/236,125, filed on Oct. 1, 2015, the entire contents of which are incorporated herein by reference for all purposes.

The present disclosure further relates to U.S. Provisional Application No. 62/253,586, filed on Nov. 10, 2015, the entire contents of which are incorporated herein by reference for all purposes.

The present disclosure further relates to U.S. Provisional Application No. 62/422,204, filed on Nov. 15, 2016, and U.S. Provisional Application No. 62/473,295, filed on Mar. 17, 2017, the entire contents of which are incorporated herein by reference for all purposes.

TECHNICAL FIELD

The present disclosure relates to an image sensor panel (ISP) and a method for fabricating an image sensor panel (ISP) which optically captures fingerprint or other images, for example, on a display screen.

BACKGROUND

Flat panel displays have been used ubiquitously as a standard output device for various stationary or mobile electronic apparatuses, such as, personal computers, laptop computers, smart phones, smart watches, televisions, hand-held video game devices, public information displays, and the like.

Recently, flat panel displays have been developed to include an image sensor panel (ISP) device disposed on a display panel device (e.g., liquid crystal display (LCD), organic light emitting diode (OLED) display, etc.) to optically capture fingerprints and other images (see, e.g., BD-001US). Photosensitive pixels can be make of various materials including amorphous silicon, polysilicon (e.g., low temperature polysilicon or LTPS), quantum dot, organic photodiode (OPD), and the like.

Currently, in the case of organic photodiodes (OPDs), a semiconducting polymeric material in liquid phase is first coated onto the entire surface of a glass or plastic substrate and then solidified to form the OPDs. As a result, the OPDs are physically connected to each other for neighboring pixels, thereby causing crosstalk as well as other undesirable drawbacks. Therefore, there is a need to develop a new method to manufacture an ISP device such that the OPDs are not physically connected.

SUMMARY

To allow backlight to pass through the ISP device, photosensitive pixels should be spatially separated to leave transparent areas on the ISP device. Additionally, an ISP device having spatially separated OPDs is advantageous in many perspectives, such as, reduction/prevention of crosstalk, mechanical stability, etc.

Accordingly, in one aspect, the present disclosure provides a method of fabricating a photopixel, the method comprising acts of: forming a well in an assembly; forming a bottom electrode in the well; forming a photosensitive layer in the well; and forming a top electrode over the photosensitive layer.

In one embodiment, forming the photosensitive layer comprises: slit coating the assembly with a photosensitive material; and removing the photosensitive material formed outside the well.

In one embodiment, the photosensitive material is an organic photon sensitive material.

In one embodiment, the slit coating is performed in an environment having a first air pressure, the method further comprising exposing the assembly after the slit coating to a second air pressure, greater than the first air pressure.

In one embodiment, the second air pressure is atmospheric pressure.

In one embodiment, the method further comprises forming a light block layer in the well prior to forming the photosensitive layer.

In one embodiment, the light block layer lines the entirety of the well.

In one embodiment, the bottom electrode is substantially opaque.

In one embodiment, the method is repeated to form a two-dimensional array of photopixels on the assembly.

In one embodiment, the top electrode is formed as a single, continuous layer covering the photosensitive layers of each photopixel in the two-dimensional array.

In another aspect, the present disclosure provides a method for manufacturing an image sensor panel having an array of photopixels. The method comprises: providing a backplane having a plurality of wells on an upper surface thereof, the backplane comprising a substrate, a control circuit on the substrate, a dielectric layer over the substrate and the control circuit, the wells being formed on the dielectric layer, and a bottom electrode at a bottom surface of the wells, the bottom electrode being electrically coupled to the control circuit; forming a photosensitive layer on the bottom electrode within the well; and forming a common electrode over the photosensitive layer.

In one embodiment, forming the photosensitive layer comprises: coating an organic photosensitive material over the upper surface of the backplane; removing excessive organic photosensitive material on the upper surface of backplane that is not situated within the well; and solidifying the organic photosensitive material situated in the well.

In one embodiment, the organic photosensitive material is in a liquid phase.

In one embodiment, coating the organic photosensitive material comprises: slit coating the organic photosensitive material in a first environment having a first air pressure; and allowing the organic photosensitive material to sag into the wells at a second environment having a second air pressure; wherein the second air pressure is greater than the first air pressure.

In one embodiment, prior to forming the photosensitive layer, forming a light block layer on the bottom electrode within the wells.

In yet another aspect, the present disclosure provides a backplane comprising: a substrate; a control circuit on the substrate; a dielectric layer over the substrate and the control circuit; a plurality of wells on an upper surface of the dielectric layer; and a bottom electrode at a bottom surface of the wells, wherein the bottom electrode is electrically coupled to the control circuit through a via.

In still another aspect, the present disclosure provides an image sensor panel comprising the backplane of claim 16, photosensitive pixels formed within the wells, and a common electrode formed over the dielectric layer of the backplane and electrically coupled to the photosensitive pixels.

DETAILED DESCRIPTION

Figure 1:
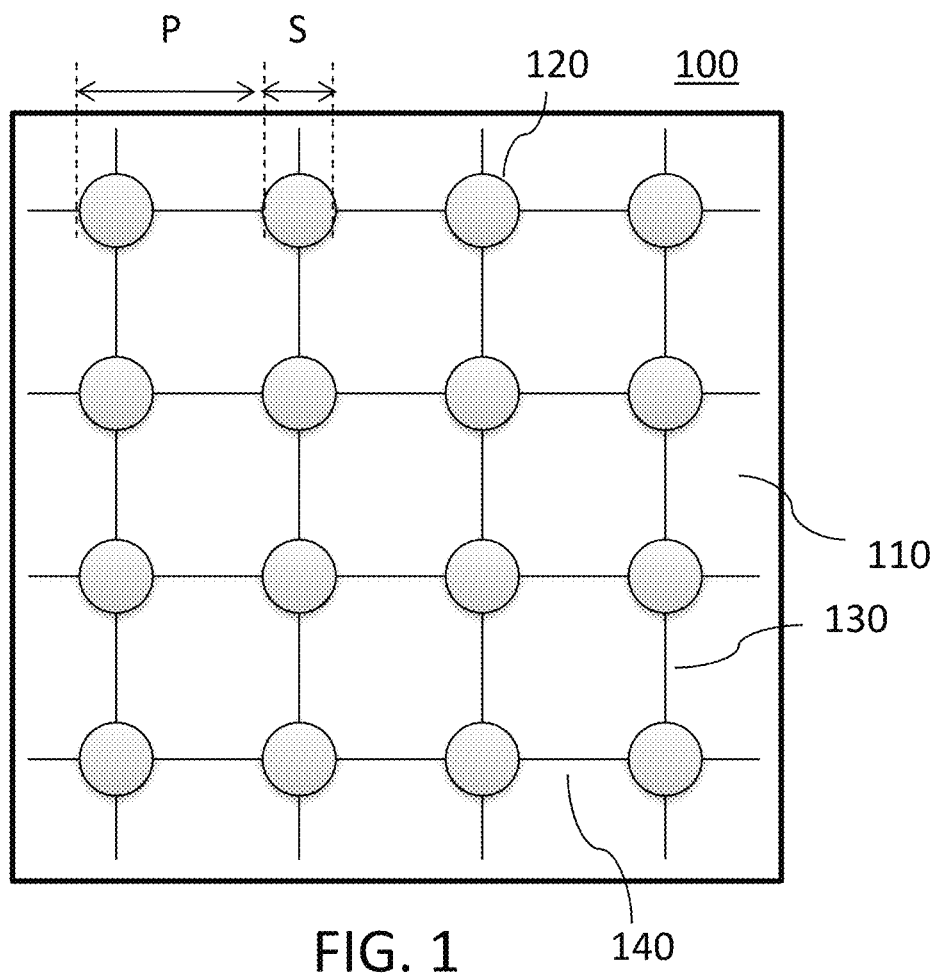
FIG. 1 is a plane view of an image sensor panel according to some embodiments.

The inventors have recognized and appreciated the need of innovative image sensor panel (ISP) designs and manufacturing methods. FIG. 1 illustrates a plane view of an exemplary ISP 100. ISP 100 includes a substrate 110, a 2D array of photosensitive pixels ("photopixels") 120, a plurality of column conductive lines 130, and a plurality of row conductive lines 140. Column lines 130 and row lines 140 are electrically coupled to respective photopixels 120 in order to read information from the photopixels.

The surface of ISP 100 has a first region occupied by the photopixels 120 and a second region that is other than the first region. The first region is opaque due to the light-absorbing nature of the photopixels (and/or the presence of light block layers when necessary). The second region may be optically transparent to opaque depending on the operating configuration intended for ISP 100.

Figure 2A:
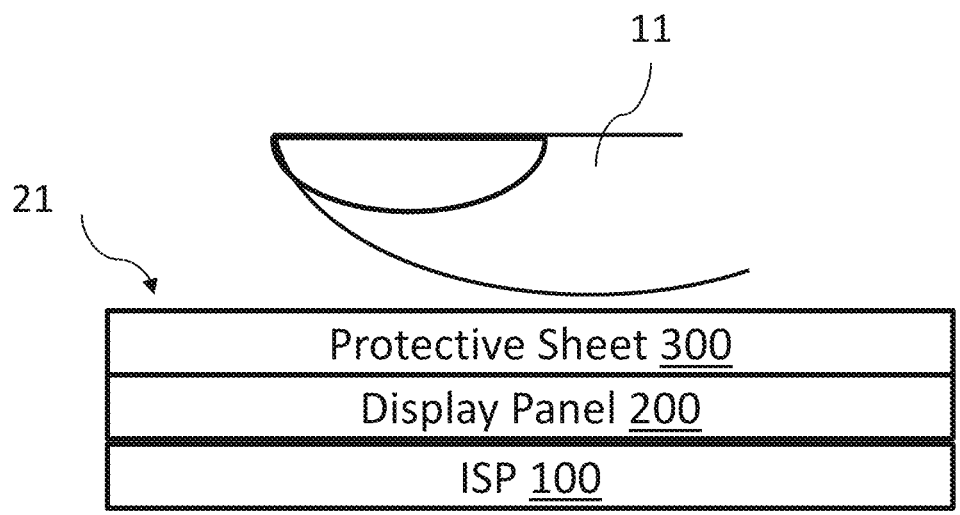
FIGS. 2A and 2B show two operating configurations of ISP with a display according to some embodiments.
Figure 2B:
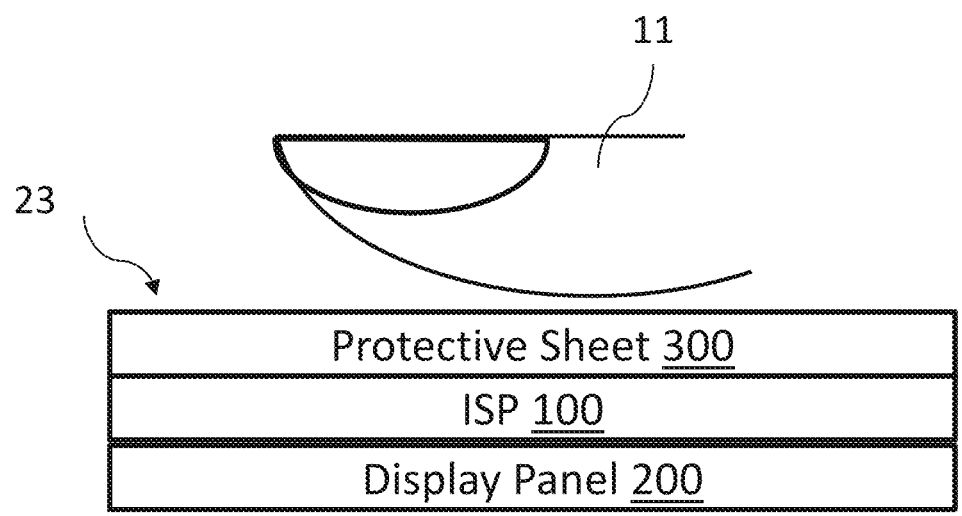

FIGS. 2A and 2B show two operating configurations of ISP 100. In configuration 21, shown in FIG. 2A, ISP 100 is below display panel 200 (relative to the surface where object 11 to be imaged is located), which itself is below protective sheet 300 (e.g., a cover glass). This configuration may be well suited for OLED display panels; though, any suitable self-emitting display panel (e.g., a quantum dot display) may be used. In configuration 21, light captured by ISP 100 is generated by display panel 200, reflected from objective 11, and captured by photopixels of ISP 100. In this embodiment, it may not be critical that the second region of ISP 100 be transparent. In fact, in this configuration the photopixels may be considerably larger as there is no requirement that the ISP 100 pass light required for the display.

In configuration 23, shown in FIG. 2B, display 200 is below ISP 100, which itself is below protective sheet 300. This configuration may be well suited for LCD (or non-self-emitting) display panels due to the necessity of a backlight module; though, any suitable display panel may be used. In contrast to configuration 21, configuration 23 requires the second region of ISP 100 to be substantially transparent in order to allow light to pass through from the display to the imaging surface of the protective sheet. Further, the second region must be sufficiently large in this configuration, to allow sufficient light to pass so as to not substantially reduce the performance of display panel 200.

Returning to FIG. 1, photopixels 120 may be formed proximate intersections of columns 130 and rows 140. In certain embodiments, photopixels 120 can be arranged in a square lattice structure, a rectangular lattice structure, a triangular lattice structure, a hexagonal lattice structure, and the like. Each of photopixels 120 can be configured to have, for example, a circular shape, an oval shape, a square shape, a rectangular shape having rounded corners, or any other suitable shapes. In the embodiment of a square lattice structure (upright or diagonal), each photosensitive pixel may have a photosensitive pixel size S (e.g., a width or diameter, depending on the pixel shape, of about 10-100 µm) and two neighboring photosensitive pixels may be separated by a pixel separation distance P. Pixel separation distance P may be about just slightly over pixel size up to 5 or more times of pixel size S. For example, pixel size S may be 20 µm, while pixel separation may be 25 µm (P=1.25 S), 30 µm (P=1.5 S), 40 µm (P=2 S), or 50 µm (P=2.5 S). Photopixels 120 are separated so as to prevent crosstalk among neighboring photosensitive pixels. Additionally, in various embodiments, where the second region must be transparent, photopixels 120 are separated to allow light to pass through ISP 100.

Figure 3:
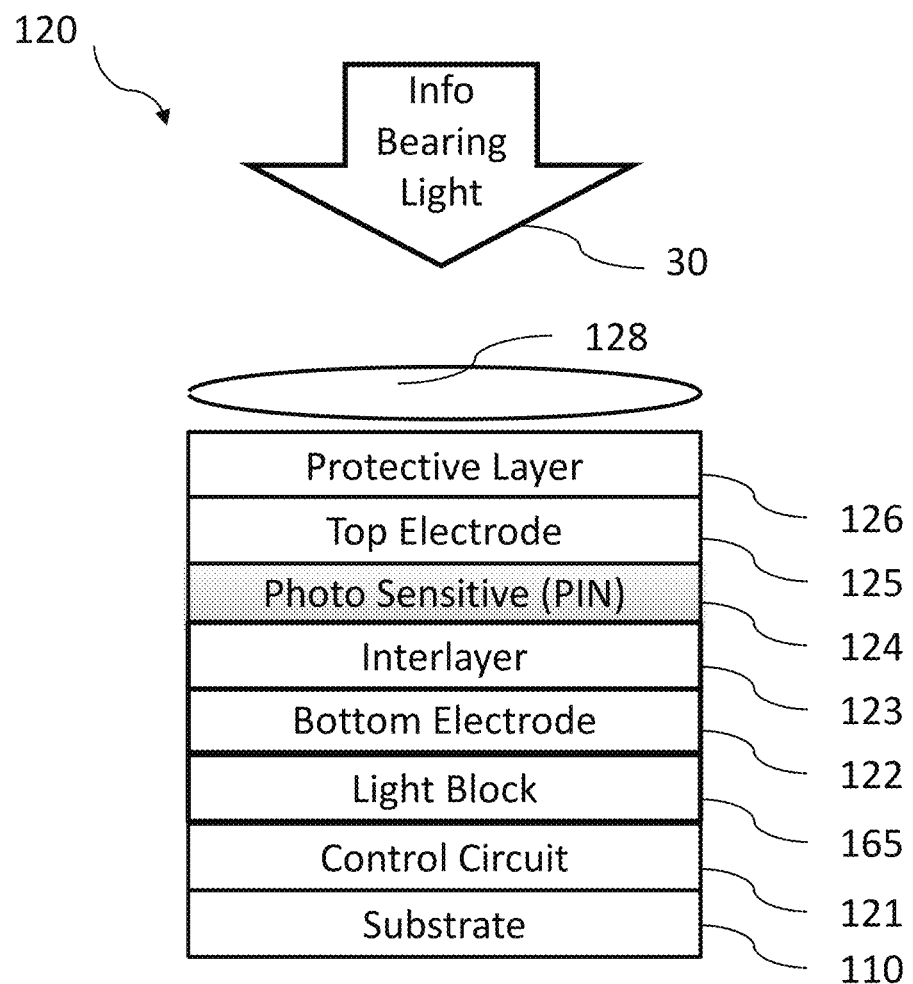
FIG. 3 is a sectional view of a photopixel according to some embodiments.

FIG. 3 illustrates a sectional view at photopixel 120 of ISP 100. The sectional view may include the functional layers of substrate 110, control circuit 121, light block 165, bottom electrode 122, interlayer 123, photosensitive layer 124, top electrode 125, protective layer 126.

Substrate 110 forms the physical support structure of ISP 100. It may be a glass, plastic or other suitable material. For ISPs used in configuration 23 substrate 100 should be a transparent material. By contrast, in configuration 21 an opaque substrate may be used. Exemplary materials for substrate 110 are glass, plastic, $SiO_2$ (Silicon Dioxide), $Si_3N_4$ (Silicon Nitride), and the like.

Control circuit 121 responds to commands to read out the individual photopixel with which it is associated. Control circuit may be implemented by one or more thin film transistors (TFTs) or in any suitable way. Examples of control circuit 121 are found in FIG. 9 as well as in FIG. 9 in BD-001 US (U.S. Pat. No. 9,122,349). Specifically, control circuit 121 may respond to a read command received on its respective row line 140 by providing a signal output on its respective column line 130 indicative of the light received at the photopixel.

In some embodiments, light block 165 is included (e.g., below the photosensitive layer 124) to prevent light other than information bearing light 30 from substantially affecting the output of photopixel 120. Light block 165 may be made from a low-conducting material such as a resin, or a metal such as silver; though, any suitable material may be used. In alternative embodiments, light block 165 can comprise two linear polarizer layers with perpendicular polarization directions, or two circular polarizer layers with opposite polarization directions (i.e., clockwise and counterclockwise).

Bottom electrode 122, interlayer 123, photosensitive layer 123, and top electrode 125 form a photodiode with bottom electrode 122 and top electrode 125 forming the terminals. (An electrical via may connect bottom electrode 122 to control circuit 121 through light block 165.)

Bottom electrode 122 may be made of indium tin oxide (ITO), a transparent electrical conductor, or another suitable conducting material. An opaque electrical conductor may be used in some embodiments such as when bottom electrode 122 is to serve as a light block.

Interlayer 123 may be included in some embodiments. Interlayer 123 may include PEDOT:PSS.

Photosensitive layer 124 may comprise semiconductor materials, e.g., amorphous silicon (a-Si), low temperature polysilicon (LTPS), metal oxide (ZnO, IGZO, etc.), and the like, which form a PIN structure. Alternatively, photosensitive layer 124 may comprise organic photon sensitive materials (sometimes referred to as organic photodetector or OPD material), carbon nanotube or fullerene based photosensitive materials, or the like. In the case of OPD, a mixture of a P-type polymer and an N-type polymer may first be formed in liquid phase within a suitable solvent (insulator). The mixture can then be applied and solidified on a TFT backplane to form photosensitive layer 124.

Top electrode 125 may be made of indium tin oxide (ITO), a transparent electrical conductor, or another suitable transparent conducting material. In some embodiments, top electrode 125 serves as a common electrode which is electrically connected to device ground when photosensitive pixel 120 is configured to detect optical signals.

Protective layer 126 may be present in some embodiments. Protective layer 126 may comprise a transparent laminating material, such as plastic and glass.

Figure 4:
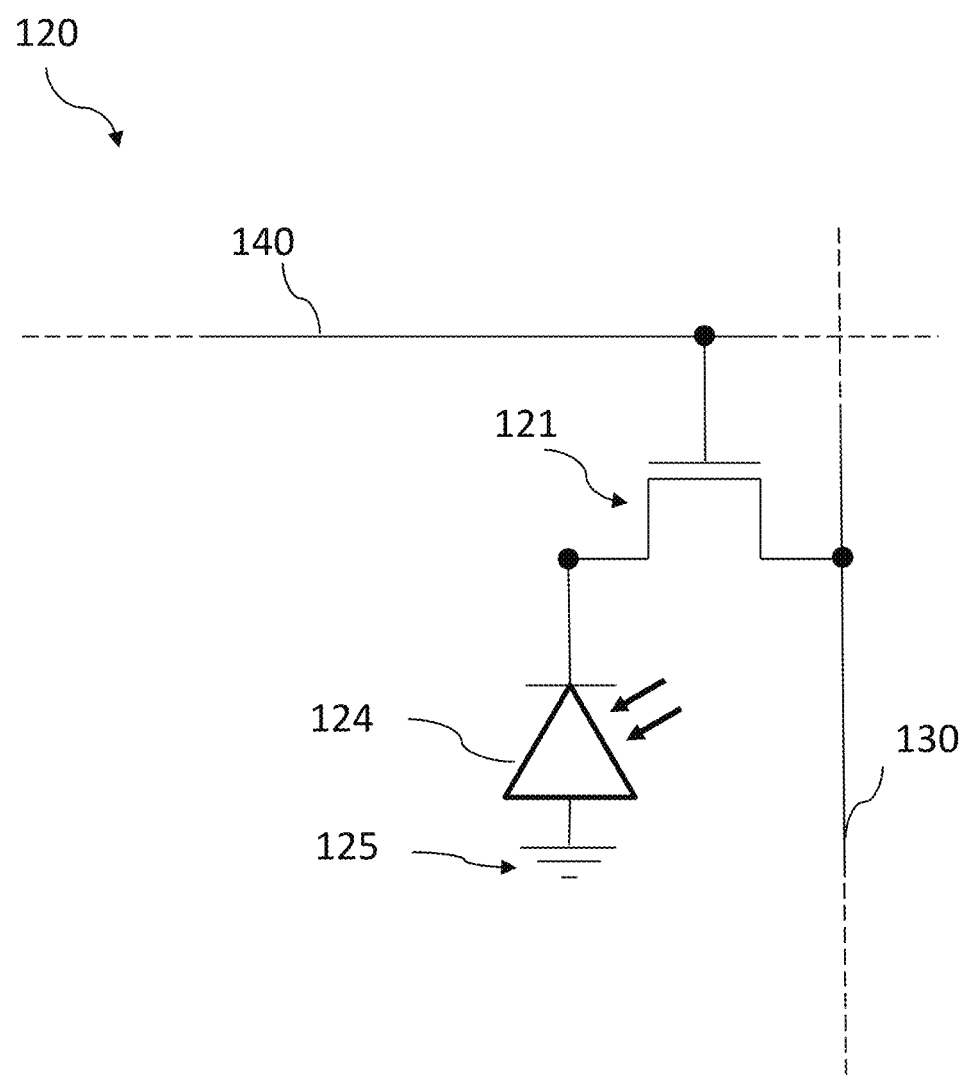
FIG. 4 is a schematic drawing of a photopixel circuit according to some embodiments.

FIG. 4 shows a schematic of one embodiment of a photosensitive pixel 120. In this embodiment, control circuit 121 is a single TFT and is thus sometimes referred to as TFT 121. It is appreciated that, in other embodiments, control circuit 121 can include two or more TFTs. The gate terminal of TFT 121 is connected to a row line 140, the drain terminal of TFT 121 is connected to column line 130, and the source terminal of TFT 121 is connected to a photodiode implemented by the photosensitive layer 124. Grounding the second terminal of the photodiode may be implemented by top electrode 125. Operationally, an ON signal is applied to row line 140 allowing signal to pass between its source and drain terminals of TFT 121. An electrical signal generated by the photoelectric effect of light reaching the photodiode passes through TFT 121 to column line 130. This electrical signal is measured by electronics electrically connected to column line 130 (see FIG. 14 of BD-001 US or U.S. Pat. No. 9,122,349).

It should be appreciated that the polarity of the non-linear circuit elements described here and shown in FIG. 4 is exemplary. Other embodiments may have elements with a different polarity.

Figure 5:
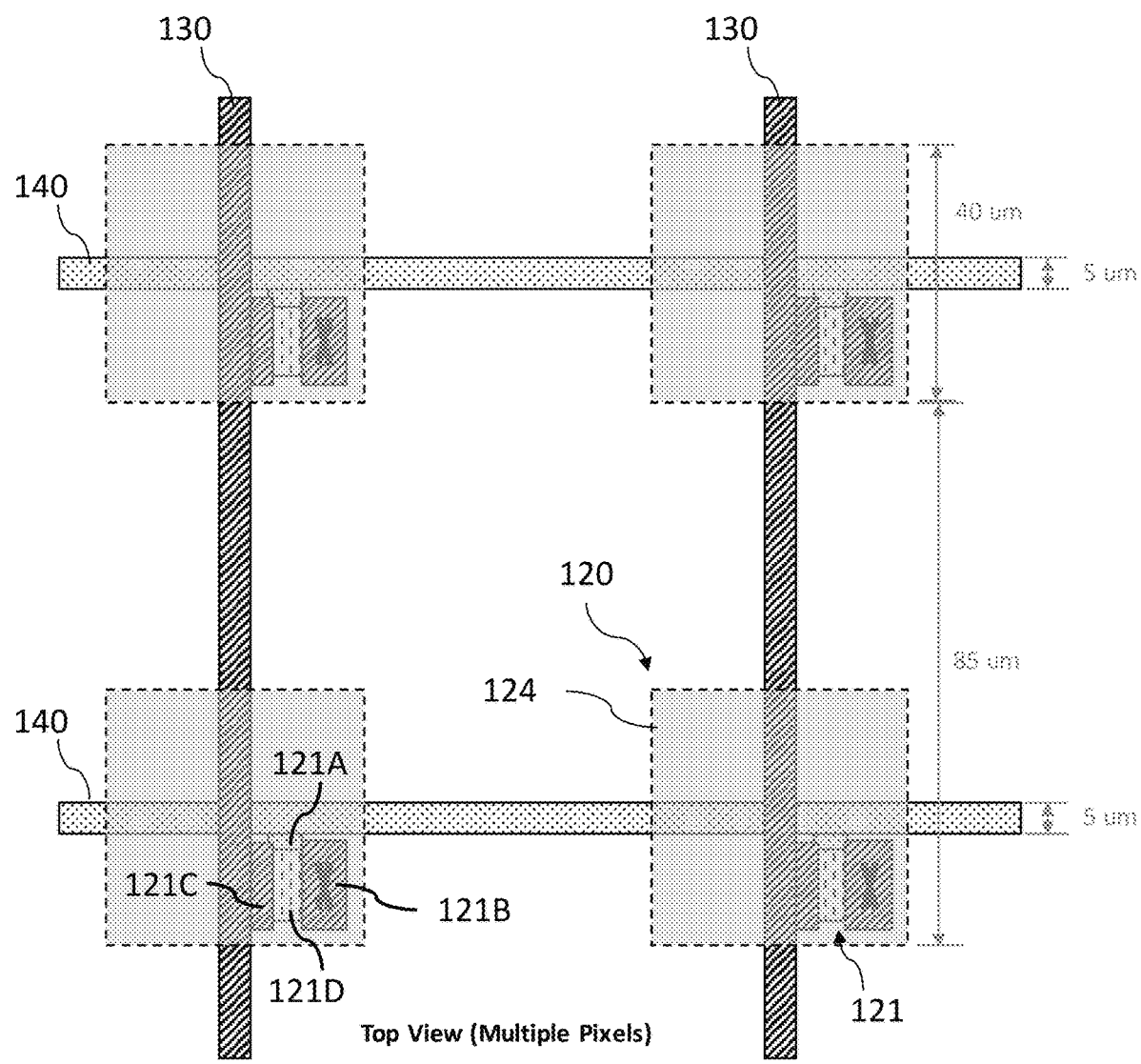
FIG. 5 is a plane view of a portion of an image sensor panel according to some embodiments.

FIG. 5 shows a plane view of a portion of ISP 100. Four photosensitive pixel 120 are shown. Note that each pixel 120 in FIG. 3 is a layout, in plane view of pixel 120 as shown in schematic in FIG. 4. Column lines 130 are electrical conductors connected to a drain terminal 121C of TFT 121, while row lines 140 are electrical conductors connected to a gate terminal 121A of TFT 121. Source terminal 121B of TFT 121 is electrically connected to photosensitive layer 124 ("X" indicates a via providing the electrical connection). Semiconducting material 121D of TFT 121 is also indicated.

Figure 6A:
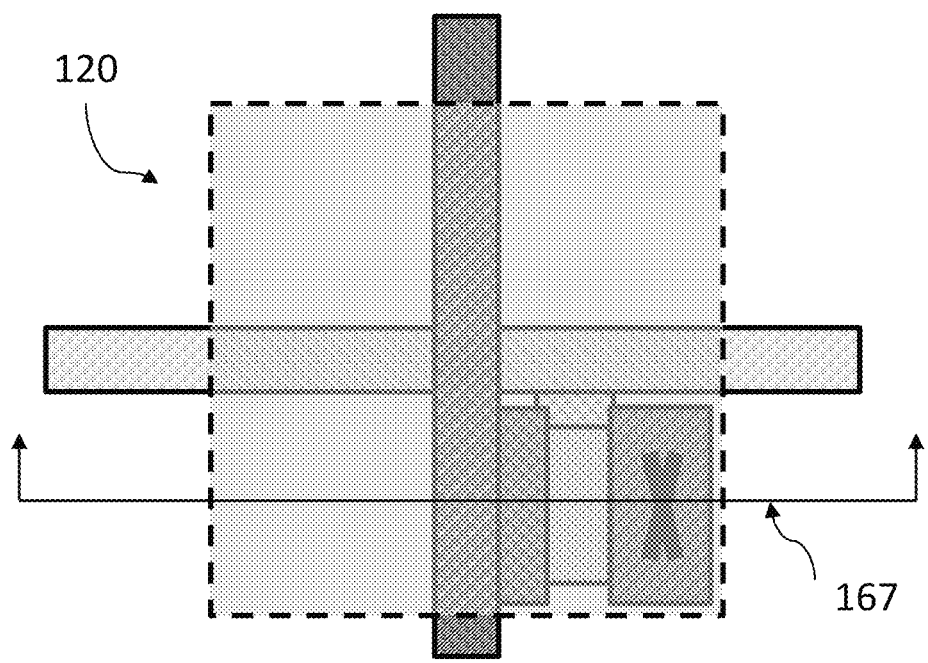
FIG. 6A is a plane view of a photopixel according to some embodiments.
Figure 6B:
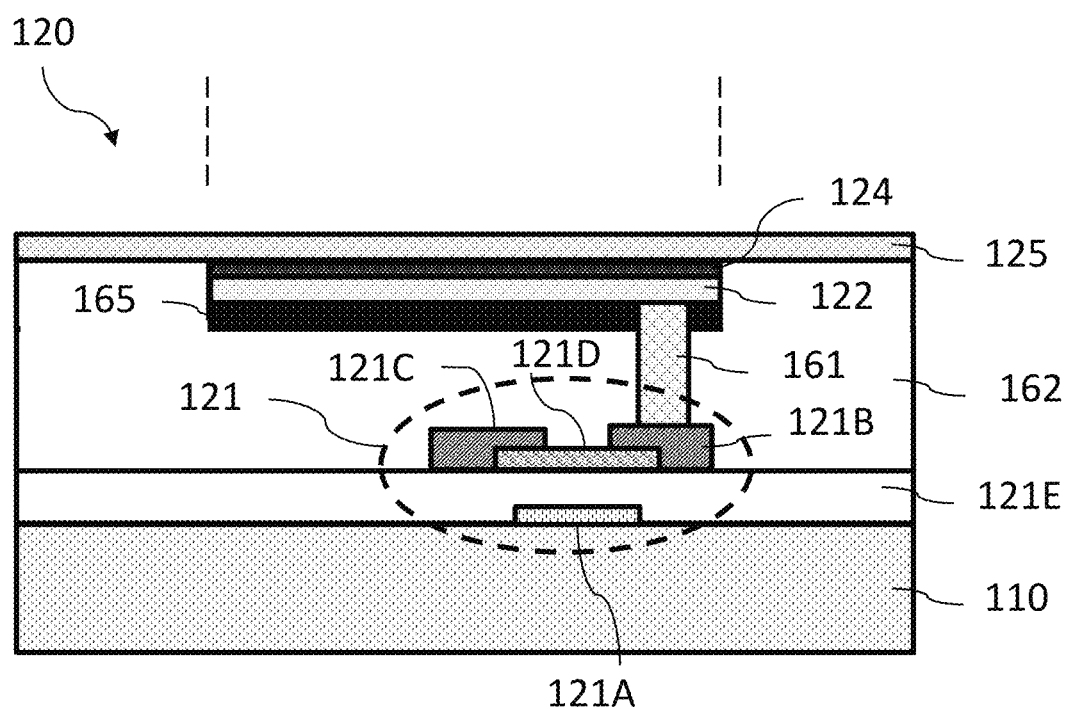
FIG. 6B is a sectional view of a photopixel according to some embodiments.

FIG. 6B is a sectional view of a photosensitive pixel 120. FIG. 6A, which shows a plane view of a pixel 120, shows the sectional cut 167 used in the sectional view of FIG. 6B. At the bottom of the sectional view of pixel 120 is substrate 110. TFT 121 is built on substrate 110. Specifically, gate electrode 121A is formed on substrate 110. Gate electrode 121A is electrically connected to row line 140 which is not visible in the sectional view due to the choice of the sectional cut.

Dielectric 121E is an electrically insulating material that separates gate electrode from semiconducting material 121D. Source electrode 121B and drain electrode 121C are in contact with semiconducting material 121D. (It is noted that column line 130 and drain electrode 121C are essentially co-located in the sectional view.) An insulating layer 162 separates TFT 121 from the photodiode formed above it. Specifically photosensitive layer 124 is in a well formed in insulating layer 162. The well may also include a bottom electrode 122 for forming a good electrical connection between photosensitive layer 124 and source electrode 121B through via 161.

In some embodiments a light block layer 165 is deposited in the well. Such a light block may be used for example, to prevent light coming from below reaching photosensitive layer 124 and substantially contributing to the electrical signal generated by the photodiode.

In some embodiments such a layer may not be included because, for example, bottom electrode 122 is sufficiently opaque (i.e., bottom electrode 122 itself serves as a light block) or light triggering the photoelectric effect is not anticipated to come from below the photosensitive layer 124.

Top electrode 125 is formed over the top surface. Top electrode 125 may be a single, transparent, electrically-conducting layer covering the entire ISP 100.

Figure 7:
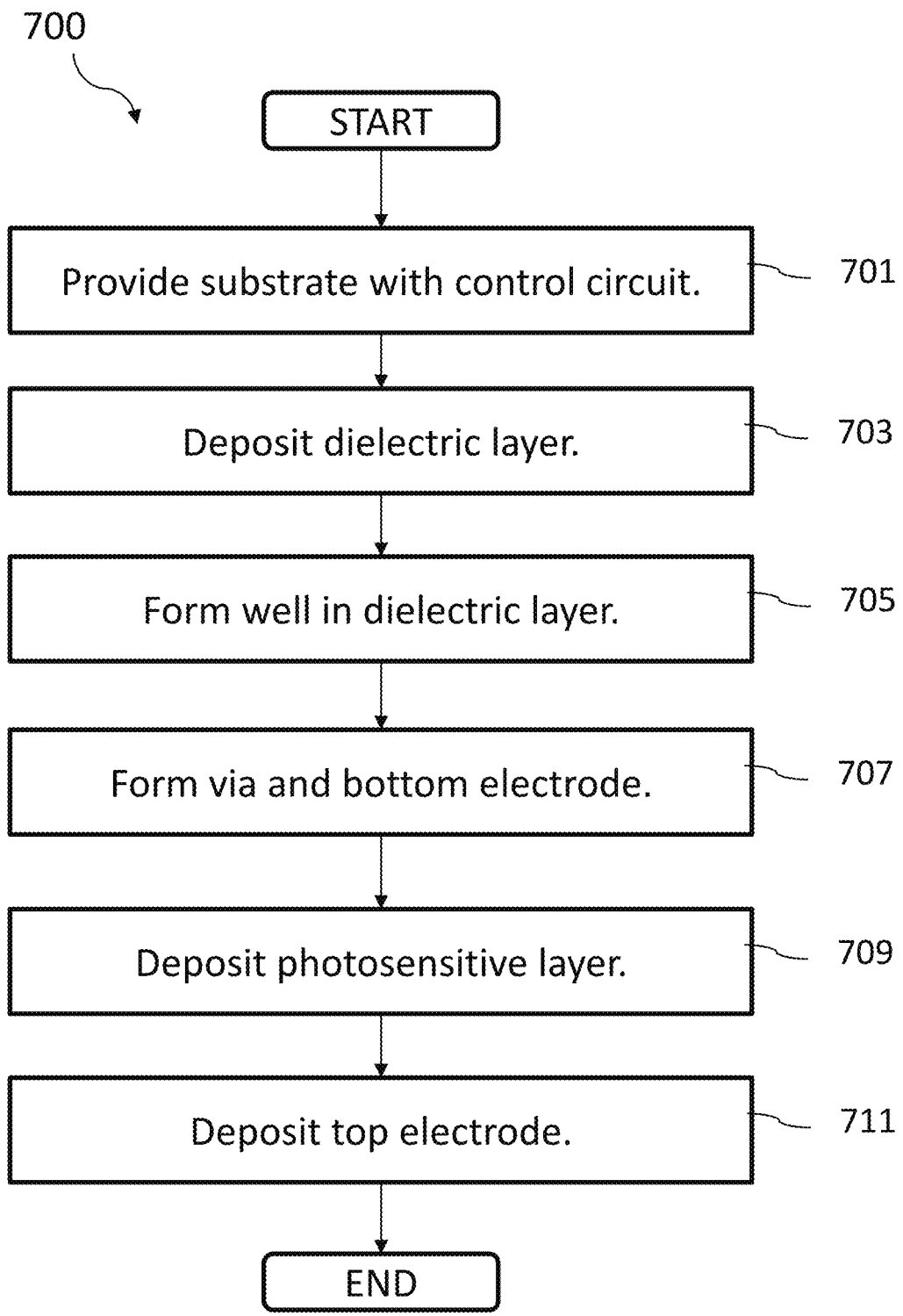
FIG. 7 is a flow diagram for a method of fabricating of photopixel according to some embodiments.

Having discussed the structure of an embodiment of photosensitive pixel 120, a method 700 of fabricating such a pixel is described in connection with FIG. 7. While method 700 is described for the fabrication of a single photopixel it should be appreciated that the method may be implemented numerous times to fabricate some or all of the photopixels of an ISP.

Reference to the assemblies shown in FIGS. 8A through 8H is made to illustrate some embodiments of method 700. Though it should be appreciated that method 700 may be implemented in any suitable way.

At step 701, a substrate is provided with a control circuit. The terminals of the control circuit include at least a terminal to a respective column line, row line, and to the photosensitive element (e.g., a photodiode). As shown in assembly 801, FIG. 8A, in some embodiments, a control circuit 121 is provided on a substrate 110. In assembly 801, control circuit 121 is a TFT.

Figure 8A:
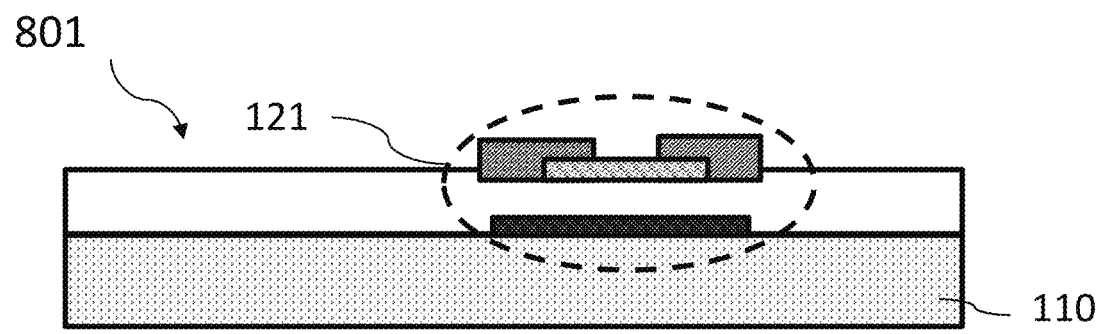
FIGS. 8A through 8H are sectional views of the photopixel assembly at various manufacturing stages.
Figure 8B:
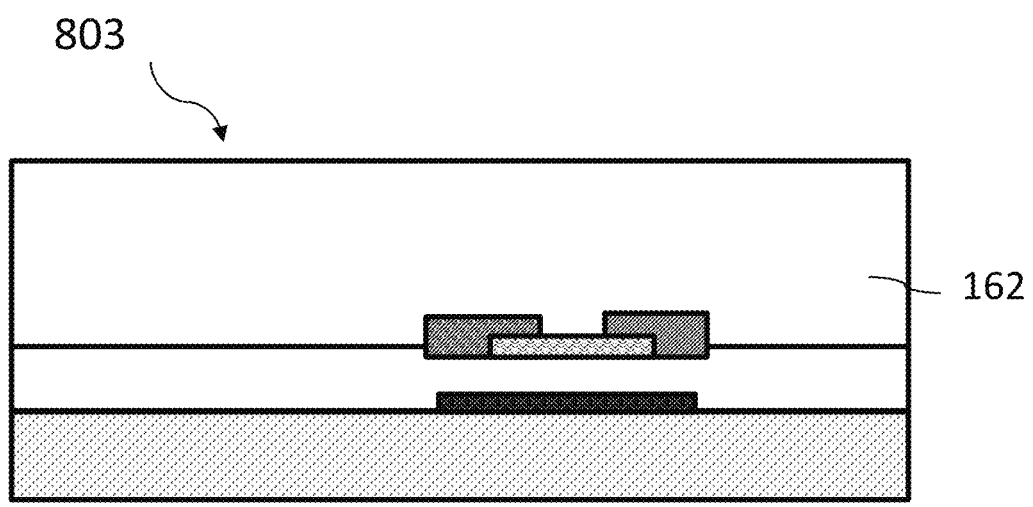
Figure 8C:
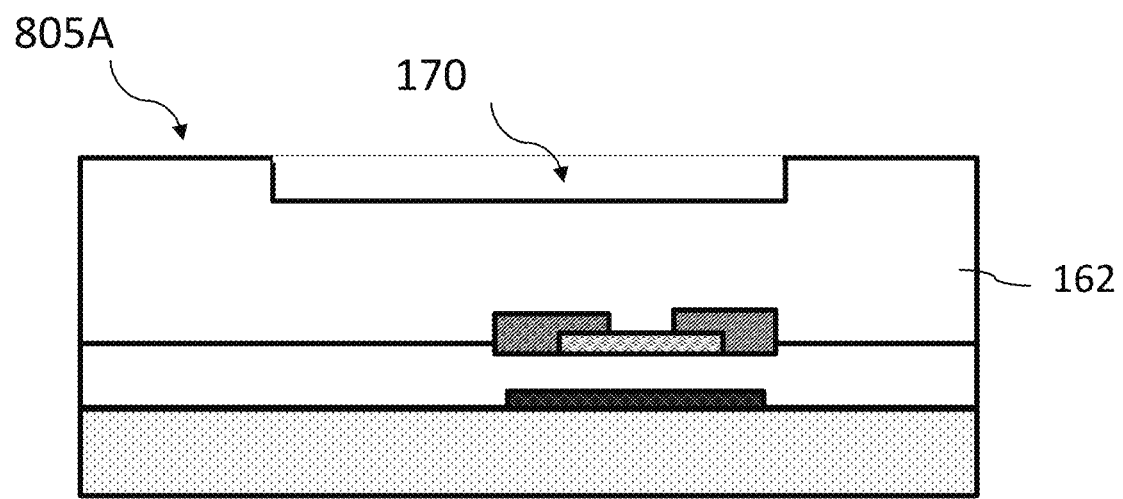
Figure 8C:
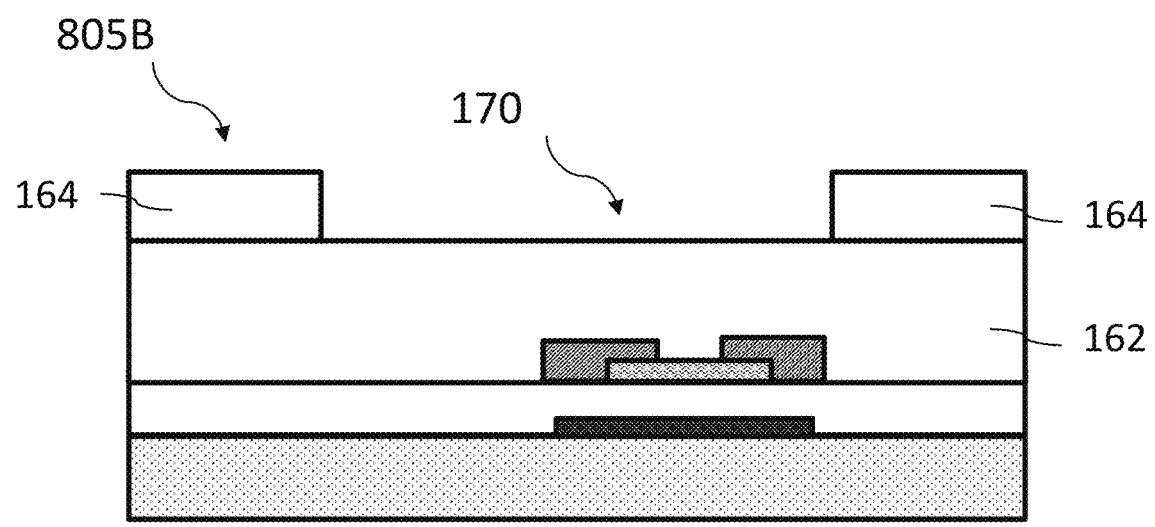

At step 703, a dielectric layer is deposited on the control circuit and the substrate provided in step 701. As shown in FIG. 8B, assembly 803 with dielectric layer 162 is the product of step 703 in some embodiments.

At step 705, a well area is formed from the dielectric layer. In some embodiments a well area is formed by removing material from the dielectric layer formed at step 703. An example of this embodiment is shown in assembly 805A in FIG. 8C. Specifically, dielectric material is removed from dielectric layer 162 forming a well 170.

In some other embodiments of step 705, the well is formed by adding additional dielectric material in areas where well is not to be formed. An example of this embodiment is shown in assembly 805B in FIG. 8C. Specifically, dielectric material 164 is formed in areas adjacent to where well 170 is to be, thereby forming well 170.

Note that the remaining assembly drawings in FIGS. 8D through 8H are shown assuming step 705 was implemented by removing dielectric material (as shown in assembly 805A). It should be appreciated that the assemblies are applicable to alternative embodiments such as those where dielectric material is added to produce a well (e.g., as shown in assembly 805B).

At step 707, a via and a bottom electrode are formed. The bottom electrode is formed in a lower portion of the well and the via provides an electrical connection from the bottom electrode to a terminal of the control circuit. The via may be formed, for example, by removing dielectric material and filling the resulting hole with electrically conducting material. As shown by assembly 807A in FIG. 8D, in some embodiments, a via 161 connects bottom electrode 122 to a terminal of control circuit 121. Specifically, assembly 807A shows via 161 connecting to source terminal 121B of a TFT.

In some embodiments of step 707, a light block layer is formed in the well below the bottom electrode. In one embodiment, the light block layer lines the entirety of the well (e.g., similar to the pool liner that lines a swimming pool). In this case, the via extends through the light block layer to provide an electrical connection to the bottom electrode. Assembly 807B shows an embodiment where light block 165 is formed in the well below bottom electrode 122 with via 161 extending through light block 165. In some embodiments, the light block layer is an electrically non-conducting material, such as a resin, or an electrically conducting or metallic material, such as silver, and is further applied to the sides of the well to further reduce undesired light from contaminating the photopixel.

Figure 8D:
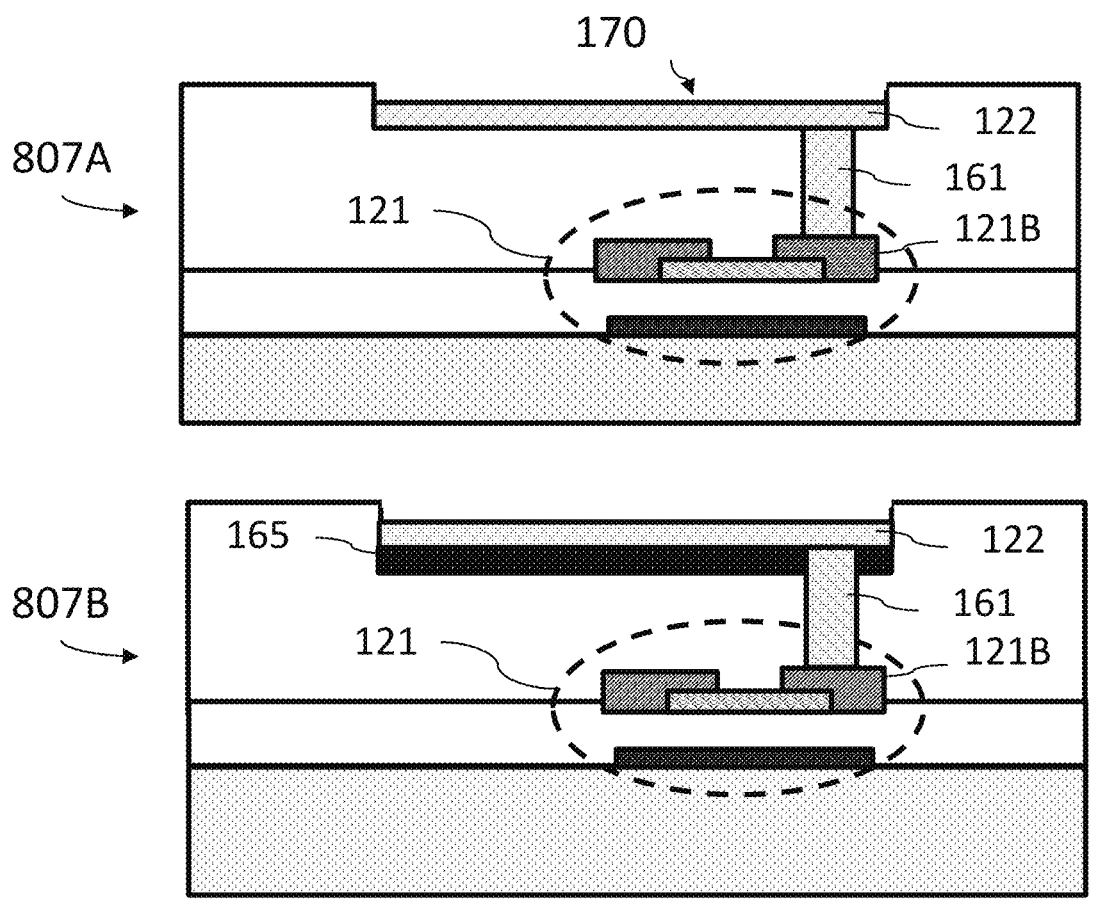
Figure 8G:
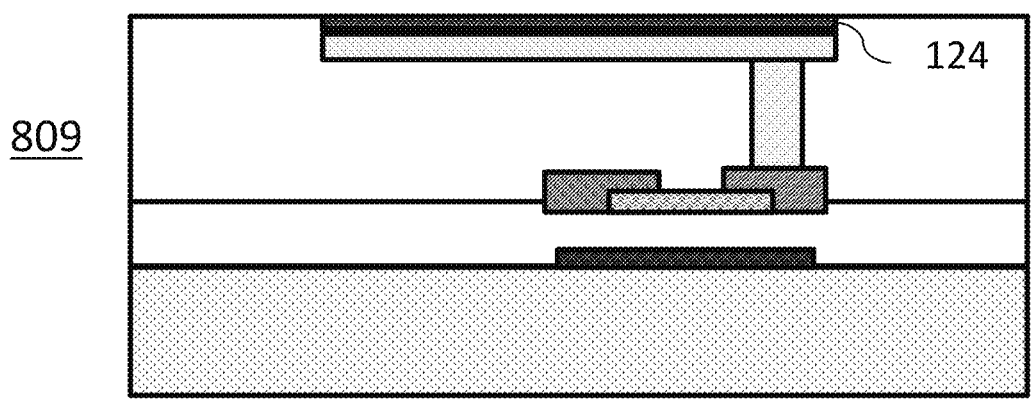
Figure 8E:
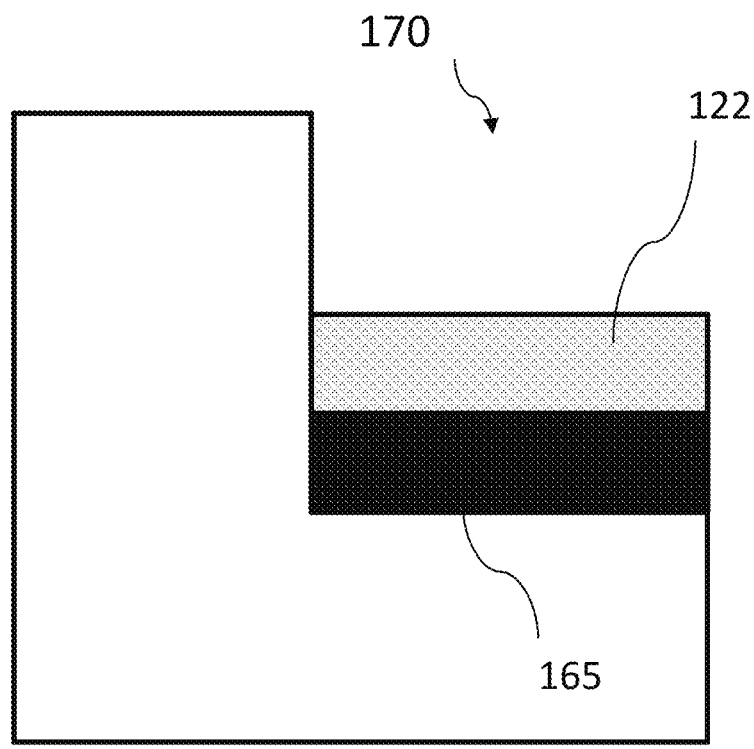
Figure 8F:
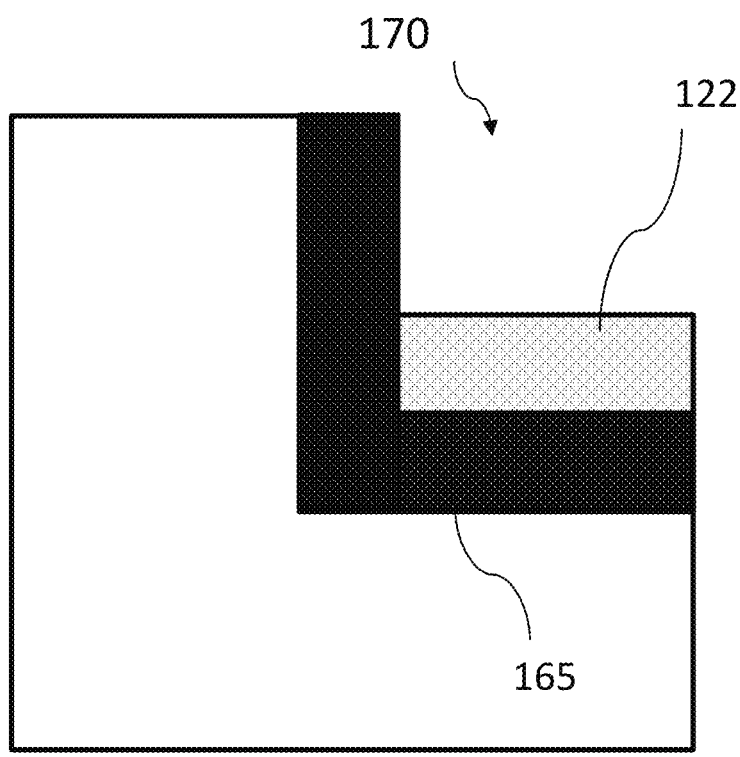

FIG. 8E shows a detail of the assembly 507B where light block 165, distinct from bottom electrode 122, is deposited along the bottom surface of well 170. FIG. 8F shows another embodiment where light block 165 covers not only the bottom of well 170 but also the side walls. Of course, where light block 165 covers the walls of well 170 and thus actually or potentially contacts top electrode 125, it is important that that it is electrically non-conductive so as to avoid shorting the terminals of the photodiode.

Note that for simplicity, the remaining assembly drawings in FIGS. 8G through 5J are shown without a light block 165. Also note that configurations 807A and 807B, as shown in FIG. 8D, are often referred to as a "backplane," which can be made together with or separately from the subsequent processes for photosensitive pixels.

At step 709, a photosensitive layer is deposited in the well. In the case of OPD, the photosensitive material (initially in liquid phase) used to form the layer may be slit coated or spray coated onto the entire surface of the assembly (i.e., both inside and outside the well). The viscosity of the photosensitive material may cause it to sag into the well rather than "flood" the well achieving good electrical contact with the bottom electrode. In embodiments where this may be an issue, the deposition (e.g., slit coating or spray coating) may be performed in a low air pressure environment. This is illustrated in assembly 810A of FIG. 8I, where a gap 7 is shown in the corner of the well. Gap 7 is an area of low air pressure.

After deposition, the assembly may be exposed to high pressure, such pressure forcing the photosensitive material to conform with the well. Any suitable pressure differential may be used in accordance with the well dimensions, material viscosity, and other physical properties. For example, the pressure difference may be about 0.5 ATM, 1 ATM, or anywhere between 0.2 and 10 ATM; though, any suitable pressure difference may be used. The result of exposing assembly 810A to a high pressure environment is shown in assembly 810B in FIG. 8J.

The photosensitive material outside the well can then be removed by, for example, wiping or polishing the upper surface of the dielectric layer, thereby leaving the desired photosensitive layer only in the well. In some embodiments, the photosensitive material is solidified in an oven by a thermal process. In some embodiments, the photosensitive layer is cleaned or polished to remove excessive photosensitive material outside of the well. Such steps may improve the photoelectric performance of the photosensitive layer (photodiode) of the photopixel. It is appreciated that, depending on the circumstances, the cleaning or polishing step can be performed before or after the photosensitive material is solidified in a thermal process. Assembly 809, shown in FIG. 8G includes photosensitive layer 124.

Figure 8H:
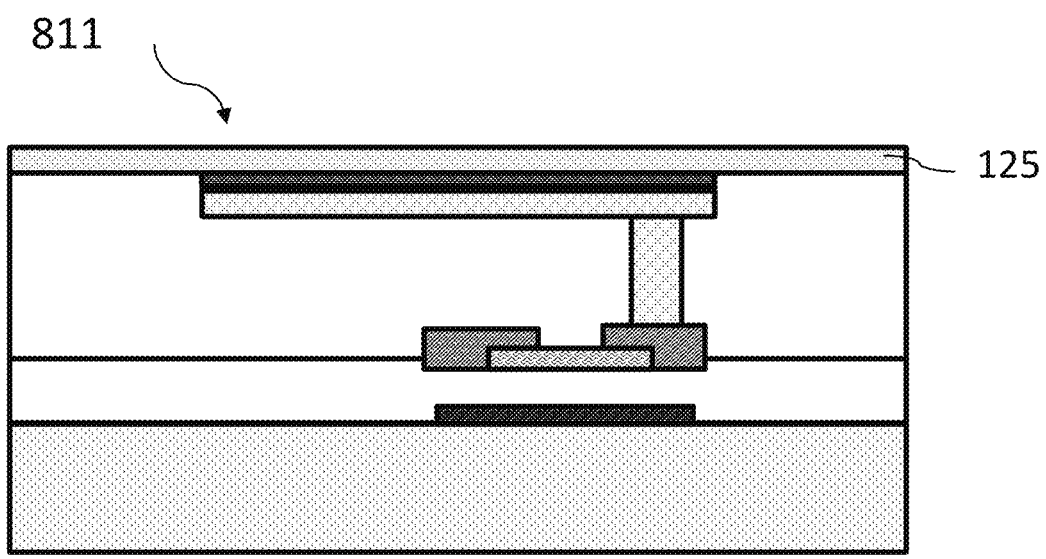
Figure 8I:
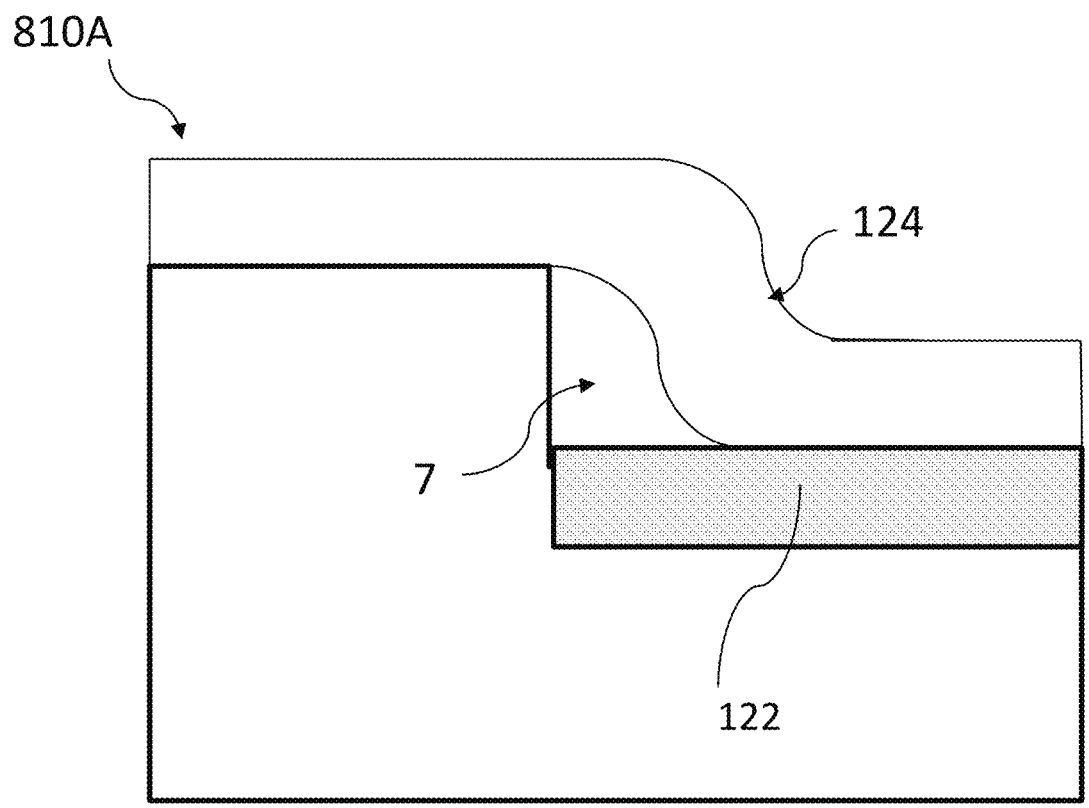
FIGS. 8I and 8J are sectional views respectively illustrating the photopixel assembly with and without a gap.
Figure 8J:
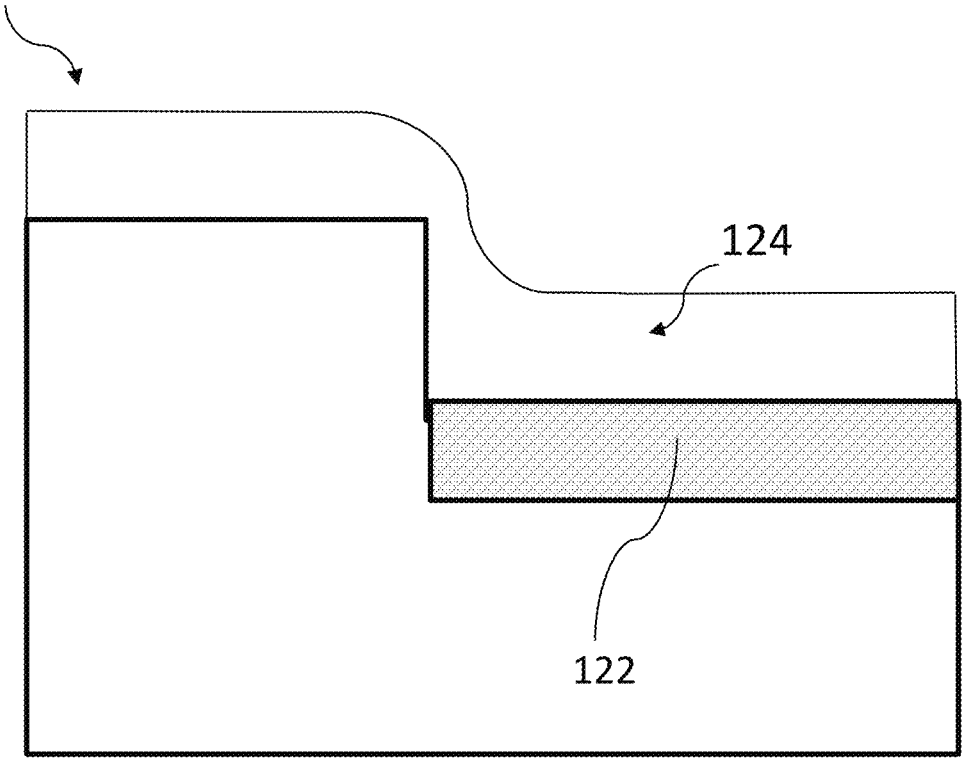

At step 711, a top electrode is deposited. The top electrode covers both the well region and the non-well region, and is electrically coupled to the photosensitive layer 124. In operation of photopixel 120, top electrode may be electrically grounded. Assembly 811, shown in FIG. 8H, shows top electrode 125 deposited in accordance with some embodiments of step 711.

EXAMPLES

Figure 9A:
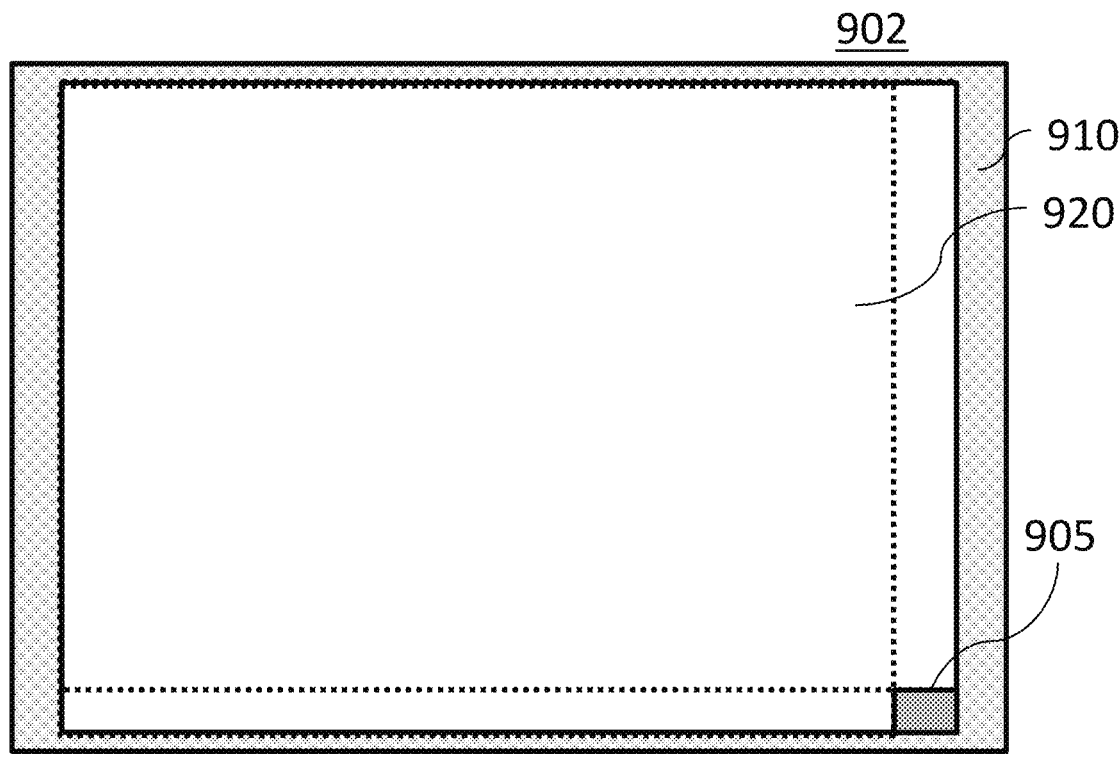
FIGS. 9A and 9B illustrate exemplary consumer electronic products including one or more image sensor panel of the present disclosure.
Figure 9B:
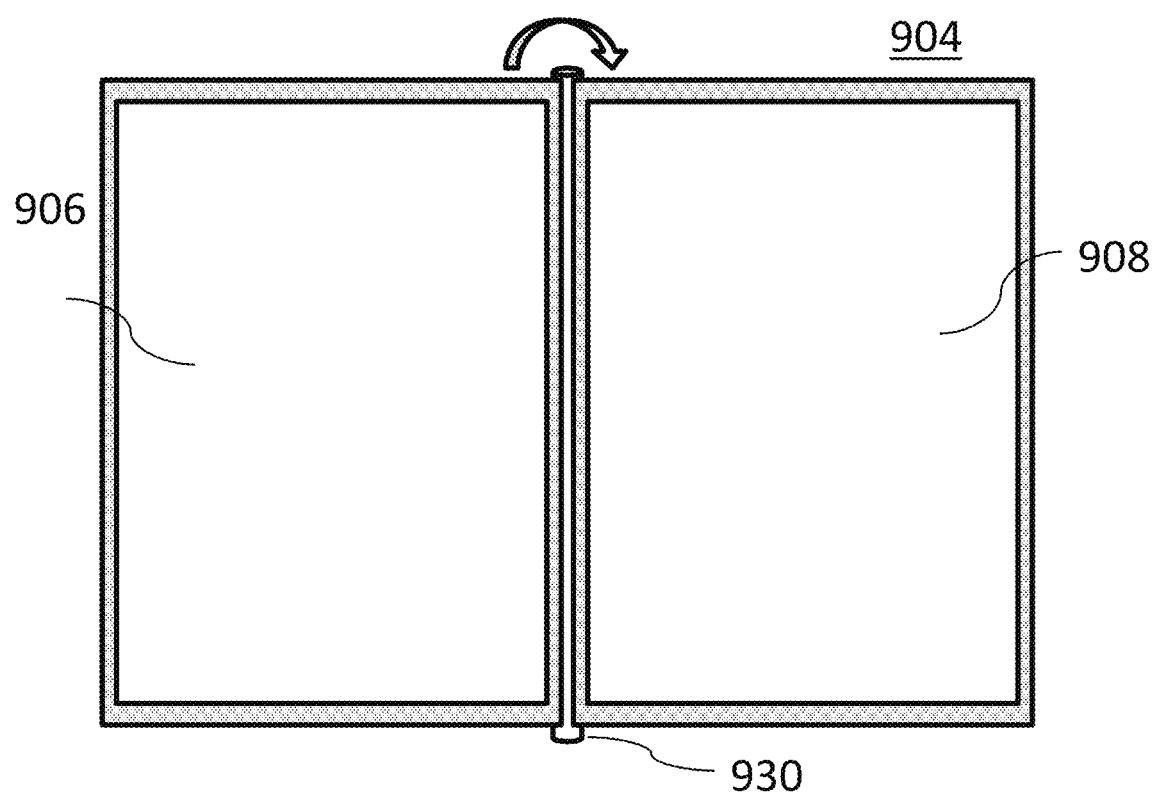

FIGS. 9A and 9B illustrate exemplary consumer electronic products including one or more image sensor panel of the present disclosure.

As shown in FIG. 9A, a portable planar scanner 902 includes a case 910 and a scanning area 920. In one embodiment, portable planar scanner 902 may have a thickness of less than 1.0 cm (or less than 0.5 cm), and scanning area 920 may be configured to scan documents of two standard paper sizes (e.g., US Letter and A4 size). In one embodiment, portable planar scanner 902 includes a backlight module and an ISP with spatially separated photosensitive pixels disposed on the backlight module (see, e.g., BD-001 US or U.S. Pat. No. 9,122,349). To easily accommodate different standard paper sizes (represented by dotted rectangles in FIG. 9A) on the same scanning area 920, one or more corners of the scanner area 920 may include a rectangular alignment block 905, which can be made as an integral part of case 910.

As shown in FIG. 9B, a two-sided planar scanner 904 includes a first planar scanner 906, a second planar scanner 908, and a hinge 930 mechanically coupled between first and second planar scanners 906 and 908, such that they can be rotated to close on top of each other. First and second planar scanners 906 and 908 may be substantially the same as planar scanner 902 as shown in FIG. 9A with or without alignment block 905, except that first and second scanners 906 and 908 may be sized to scanner anything other than standard sized paper. In operation, one side of a two-sized printed material (e.g., business card, credit card, and the like) may be placed on one of first and second planar scanners 906 and 908. The other one of the first and second planar scanners 906 and 908 may then be rotated along hinge 930 to cover the other side of the two-sided printed material.

As such, images for both sides of the two-sided printed material can be captured by first and second planar scanners 906 and 908.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical values appeared in this specification are deemed modified by a term of degree thereby reflecting their intrinsic uncertainty.

Although various embodiments of the present disclosure have been described in detail herein, one of ordinary skill in the art would readily appreciate modifications and other embodiments without departing from the spirit and scope of the present disclosure.

What is claimed is:

1. A method of fabricating a photopixel, the method comprising acts of:
    forming a well in an assembly;
    forming a bottom electrode in the well;
    forming a photosensitive layer in the well comprising:
        slit coating the assembly with a photosensitive material in an environment having a first air pressure;
        exposing the assembly after the slit coating to a second air pressure greater than the first air pressure; and
        removing the photosensitive material formed outside the well; and
    forming a top electrode over the photosensitive layer.

2. The method of claim 1, wherein the photosensitive material is an organic photon sensitive material.

3. The method of claim 1, wherein the second air pressure is atmospheric pressure.

4. The method of claim 1, further comprising forming a light block layer in the well prior to forming the photosensitive layer.

5. The method of claim 4, wherein the light block layer lines the entirety of the well.

6. The method of claim 1, wherein the bottom electrode is substantially opaque.

7. The method of claim 1, wherein the method is repeated to form a two-dimensional array of photopixels on the assembly.

8. The method of claim 7, wherein the top electrode is formed as a single, continuous layer covering the photosensitive layers of each photopixel in the two-dimensional array.

9. A method for manufacturing an image sensor panel having an array of photopixels, the method comprising:
    providing a backplane having a plurality of wells on an upper surface thereof, the backplane comprising a substrate, a control circuit on the substrate, a dielectric layer over the substrate and the control circuit, the wells being formed on the dielectric layer, and a bottom electrode at a bottom surface of the wells, the bottom electrode being electrically coupled to the control circuit;
    forming a photosensitive layer on the bottom electrode within the well; and
    forming a common electrode over the photosensitive layer; wherein forming the photosensitive layer comprises:
        coating an organic photosensitive material over the upper surface of the backplane;
        removing excessive organic photosensitive material on the upper surface of backplane that is not situated within the well; and
        solidifying the organic photosensitive material situated in the well; wherein coating the organic photosensitive material comprises:
        slit coating the organic photosensitive material in a first environment having a first air pressure; and
        allowing the organic photosensitive material to sag into the wells at a second environment having a second air pressure;
        wherein the second air pressure is greater than the first air pressure.

10. The method of claim 9, wherein the organic photosensitive material is in a liquid phase.

11. The method of claim 9, wherein prior to forming the photosensitive layer, forming a light block layer on the bottom electrode within the wells.

12. A method for manufacturing an image sensor panel, the method comprising:
    forming a plurality of wells on an upper surface of a backplane;
    coating a photosensitive material over the upper surface of the backplane such that at least a portion of the photosensitive material sags into the wells;
    removing photosensitive material on the upper surface of backplane outside of the wells;
    solidifying the photosensitive material situated in the wells; and
    forming a common electrode over the upper surface of the backplane; wherein coating the photosensitive material comprises:
    slit coating the photosensitive material in a first environment having a first air pressure; and
    allowing the photosensitive material to sag into the wells at a second environment having a second air pressure; and
    wherein the second air pressure is greater than the first air pressure.

13. The method of claim 12, wherein the backplane comprises a substrate, a control circuit on the substrate, a dielectric layer over the substrate and the control circuit, and a bottom electrode at a bottom surface of the wells, the bottom electrode being electrically coupled to the control circuit, wherein the wells are formed in the dielectric layer.

14. The method of claim 12, further comprising forming a bottom electrode at a bottom surface of the wells after forming said plurality of wells.

15. The method of claim 12, further comprising forming a light block layer on a bottom surface of the wells.

* * * * *